(12) United States Patent
Kang et al.

(10) Patent No.: US 8,748,914 B2
(45) Date of Patent: Jun. 10, 2014

(54) ORGANIC LIGHT-EMITTING DISPLAY DEVICE AND METHOD OF FABRICATING THE SAME

(75) Inventors: Jin-Goo Kang, Seoul (KR); Joo-Hwan Shin, Hwaseong-Si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/454,755

(22) Filed: Apr. 24, 2012

(65) Prior Publication Data

US 2013/0069085 A1 Mar. 21, 2013

(30) Foreign Application Priority Data

Sep. 20, 2011 (KR) .................. 10-2011-0094808

(51) Int. Cl.
*H01L 27/15* (2006.01)

(52) U.S. Cl.
USPC .............. 257/89; 257/40; 257/88; 257/90; 257/E33.058; 257/E51.022; 438/28; 349/58; 349/153

(58) Field of Classification Search
USPC .............. 257/40, 88–90; 438/28; 445/24, 25; 313/498–512; 349/58, 153, 155
See application file for complete search history.

(56) References Cited

U.S. PATENT DOCUMENTS

| | | | |
|---|---|---|---|
| 6,466,294 B1 | 10/2002 | Yamagishi et al. | |
| 7,109,655 B2 * | 9/2006 | Kurihara | 313/512 |
| 2005/0040762 A1 | 2/2005 | Kurihara | |
| 2007/0108899 A1 * | 5/2007 | Jung et al. | 313/506 |
| 2007/0120464 A1 * | 5/2007 | Okutani et al. | 313/501 |
| 2009/0066242 A1 * | 3/2009 | Koo | 313/506 |
| 2010/0072482 A1 * | 3/2010 | Eom et al. | 257/72 |
| 2010/0159789 A1 * | 6/2010 | Kim | 445/25 |

OTHER PUBLICATIONS

Korean Office Action, Korean Application No. 10-2011-0094808, Mar. 21, 2014, 28 pages (with English concise explanation of relevance).

German Patent and Trademark Office, Office Action, German Patent Application No. 10 2012 106 131.9, Mar. 18, 2014, eleven pages.

* cited by examiner

*Primary Examiner* — Cheung Lee
*Assistant Examiner* — Stephen Bradley
(74) *Attorney, Agent, or Firm* — Fenwick & West LLP

(57) ABSTRACT

Disclosed is an organic light-emitting display device capable of preventing the occurrence of cracks at corner regions of an adhesive layer. The organic light-emitting display device includes a first substrate including a plurality of pixels and a second substrate. A thin film transistor (TFT) located at each pixel of the first substrate. A pixel electrode is also located at each pixel. An organic light-emitting unit that emits light is coupled to each pixel electrode. A common electrode is electrically coupled to each organic light-emitting unit. An adhesive layer is coupled to the common electrode. The adhesive layer attaches the first and second substrates. The corner regions of the adhesive layer are rounded in order to control the creation of cracks in the adhesive layer and thereby prevent moisture from entering the active area of the device.

8 Claims, 8 Drawing Sheets

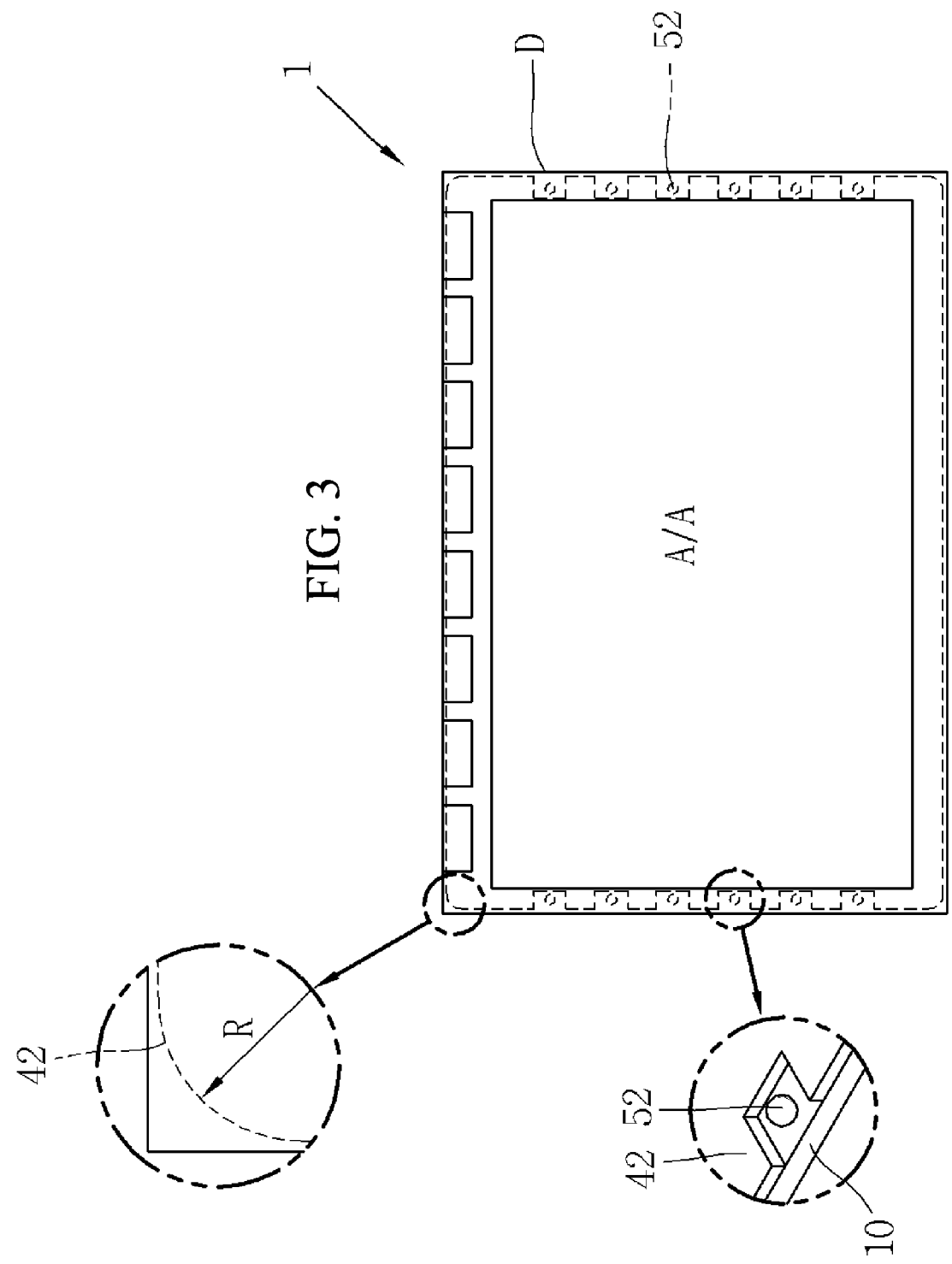

ORGANIC LIGHT-EMITTING DISPLAY DEVICE AND METHOD OF FABRICATING THE SAME

CROSS REFERENCE TO RELATED APPLICATION

This application claims the benefit of Korean Patent Application No. 10-2011-0094808, filed on Sep. 20, 2011, which is incorporated by reference herein in its entirety.

BACKGROUND OF THE DISCLOSURE

1. Field of the Disclosure

The present disclosure relates to an organic light-emitting display device, and particularly, to designs of adhesive layers of an organic light-emitting display device to control the introduction of cracks in the adhesive layer.

2. Discussion of the Related Art

Organic light-emitting display devices have been noted as being one potential type of next generation display device due to the advantages inherent in their design, for example their high light-emitting efficiency, ease of constructing a large area device, simplified manufacturing processes, their ability to produce blue light, and their inherent physical flexibility. A great deal of research is ongoing on an active matrix light-emitting display devices having an active driving device on each pixel.

An organic light-emitting display device includes an anode, a cathode, and an organic light-emitting unit formed between the anode and the cathode. The organic light-emitting unit emits a white light. The organic light-emitting unit deposits materials for emitting red, green and blue lights on each other so that a synthesized light can appear white.

In an organic light-emitting display device, the anode, the cathode, and the organic light-emitting unit are generally formed on a transparent first substrate such as glass. A second substrate is formed above the first substrate. The first and second substrates are attached to each other by an adhesive layer in an encapsulating manner. Accordingly, foreign materials, such as moisture, are prevented from entering into the organic light-emitting display device.

To attach the first and second substrates to each other, an attachment pressure is applied to the first and second substrates. In existing organic light-emitting display devices, the attachment pressure creates an attachment pressure stress on the substrates that is greater on the corner regions of the organic light-emitting display device than it is on a central region or on the four sides of the organic light-emitting display device. This may cause the adhesive layer to be more concentrated to the corner regions. As a result, cracks may form in the adhesive layer in the corner regions when the adhesive layer is hardened. Moisture may penetrate through the cracks into the organic light-emitting display device. This will negatively affect the quality of the organic light-emitting display device, for example by shortening the lifespan of the device.

SUMMARY

An organic light-emitting display device is described that is capable of preventing the occurrence of cracks in an adhesive layer at the corner regions. The design of the device includes corner regions that have a rounded shape, so that cracks formed in the adhesive layer due to the application of pressure are formed in a more controlled manner. With rounded corner regions, cracks large enough to allow moisture to enter the active area are less likely to form. As a result, moisture is prevented from reaching the active area of the organic light-emitting display device.

In one embodiment, an organic light-emitting display device includes a first substrate including a plurality of pixels and a second substrate. A thin film transistor (TFT) is located at each pixel of the first substrate. A pixel electrode is also located at each pixel. An organic light-emitting unit that emits light is coupled to each pixel electrode. A common electrode is electrically coupled to each organic light-emitting unit. An adhesive layer is coupled to the common electrode. The adhesive layer attaches the first and second substrates. The corner regions of the adhesive layer are rounded in order to control the size of cracks created and thereby prevent moisture from entering the active area of the device.

The organic light-emitting unit may include an organic light-emitting layer; an electron injection layer configured to inject an electron; an electron transport layer configured to transport an electron injected through the electron injection layer to the organic light-emitting layer; a hole injection layer configured to inject a hole; and a hole transport layer configured to transport a hole injected through the hole injection layer. Here, the pixel electrode may be an anode, and the common electrode may be a cathode.

The adhesive layer may be formed of a material selected from a group consisting of an epoxy-based compound, an acrylate-based compound, and an acryl-based rubber. The adhesive layer may be deposited in a thickness of 5~100 μm. The round shape on the corner regions may include a circular shape, an oval shape or a wave shape. In case of the circular or oval shape, the radius of a corner region may be in the range of 0.5~5 mm.

In order to prevent signal delay in larger organic light-emitting display devices, additional metallic connections may be added to provide additional electrical connections that reduce signal delay. In one embodiment, a first metallic pattern electrically connected to the pixel electrode may be formed on an outer peripheral region of the first substrate. A second metallic pattern may be formed on an outer peripheral region of the second substrate. The first metallic pattern and the second metallic pattern are connected to each other by an auxiliary electrode, thereby providing an additional electrical connection. The auxiliary electrode may be implemented as a silver (Ag) dot, and the adhesive layer may be formed between the first and second metallic patterns.

In one embodiment, a method of fabricating an organic light-emitting display device includes forming a thin film transistor (TFT) at each of a plurality of pixels of a first substrate; forming an organic light-emitting unit at each of the pixels of the first substrate; forming an adhesive layer between the first substrate and a second substrate, the adhesive layer comprising a plurality of corner regions, each corner region having a rounded shape; and attaching the first and second substrates with the adhesive layer.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

FIG. 3 is a planar view of an organic light-emitting display device according to the present disclosure.

DESCRIPTION OF SPECIFIC EMBODIMENTS

Description will now be given in detail of the exemplary embodiments, with reference to the accompanying drawings. For the sake of brief description with reference to the drawings, the same or equivalent components will be provided with the same reference numbers, and description thereof will not be repeated.

The organic light-emitting display device controls the formation of cracks in the adhesive layer by rounding the corner regions of the adhesive layer. Rounding the corner regions prevents the formation of large cracks in the adhesive layer that would otherwise allow moisture to reach the active area of the display device.

Figure 1:
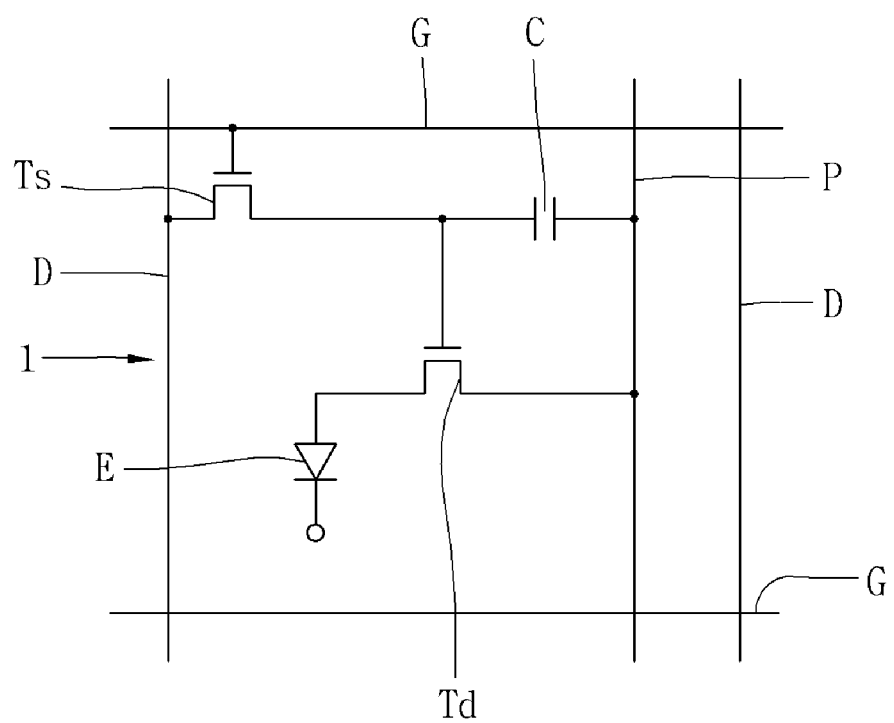
FIG. 1 is a view showing an equivalent circuit of an organic light-emitting display device according to the present disclosure.

FIG. 1 is a view showing an equivalent circuit of an organic light-emitting display device according to the present disclosure. As shown in FIG. 1, the organic light-emitting display device 1 comprises a plurality of pixels defined by gate lines (G) and data lines (D) crossing each other in horizontal and vertical directions. In each pixel, a power line (P) is formed in parallel to the data line (D).

Each pixel is provided therein with a switching thin film transistor (Ts), a driving thin film transistor (Td), a capacitor (C) and an organic light-emitting device (E). A gate electrode of the Ts is connected to the gate line (G), a source electrode of the Ts is connected to the data line (D), and a drain electrode of the Ts is connected to a gate electrode of the Td. A source electrode of the Td is connected to the power line (P), and a drain electrode of the Td is connected to the light-emitting device (E).

Once a scan signal is input to the organic light-emitting display device through the gate line (G), the scan signal is applied to the gate electrode of the Ts to drive the Ts. As the Ts is driven, a data signal input to the organic light-emitting display device through the gate line (D) is applied to the gate electrode of the Td through the source electrode and the drain electrode. As a result, the Td is driven. As the Td is driven, a current flowing on the power line (P) is applied to the light-emitting device (E) through the source electrode and the drain electrode. Here, a current outputted from the Td has a different size according to a voltage between the gate electrode and the drain electrode.

The light-emitting device (E), an organic light-emitting device displays an image by emitting light as a current is applied thereto through the Td. Here, the intensity of an emitted light is varied according to the intensity of an applied current. Accordingly, the intensity of an emitted light may be controlled by controlling the intensity of an applied current.

Figure 2:
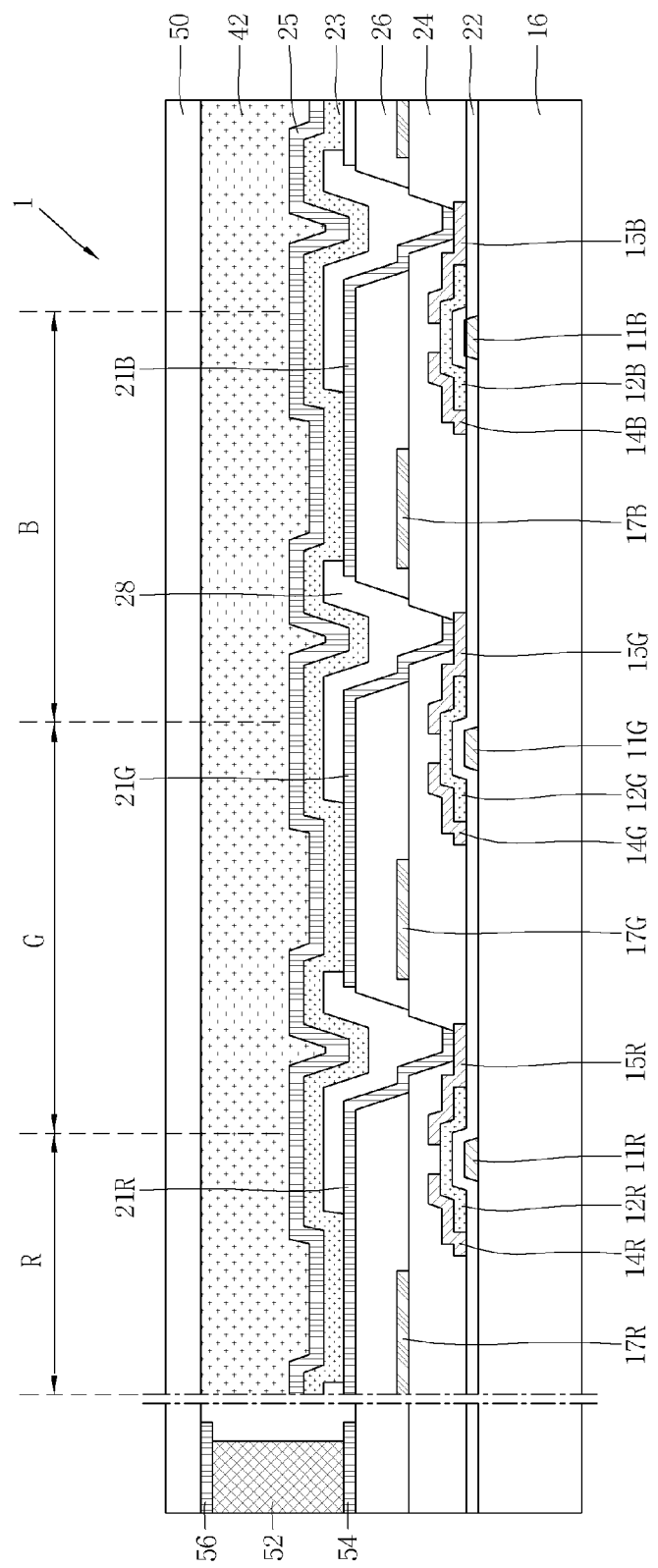
FIG. 2 is a sectional view showing a structure of an organic light-emitting display device according to the present disclosure.

FIG. 2 is a sectional view showing a structure of an organic light-emitting display device according to the present disclosure. The structure of the organic light-emitting display device according to the present disclosure will be explained with reference to FIG. 2. As shown in FIG. 2, the organic light-emitting display device comprises an R pixel for outputting a red light, a G pixel for outputting green light, and a B pixel for outputting a blue light. Although not shown, the organic light-emitting display device according to the present disclosure may further comprise a W pixel for outputting a white light. The W pixel may output a white light to enhance an entire brightness of the organic light-emitting display device.

Each R, G and B pixel is provided with a color filter layer, thereby outputting a white light outputted from an organic light-emitting pixel into light of a specific color. However, the W pixel outputs a white light outputted from the organic light-emitting unit as it is, without a color filter layer.

As shown in FIG. 2, a first substrate 10 formed of a transparent material such as glass or plastic is divided into R, G and B pixels, and each R, G and B pixel is provided with a driving TFT.

The driving TFT consists of gate electrodes 11R, 11G and 11B formed on the R, G and B pixels of the first substrate 10, semiconductor layers 12R, 12G and 12B formed over the first substrate 10 where the gate electrodes 11R, 11G and 11B have been formed, and source electrodes 14R, 14G and 14B and drain electrodes 15R, 15G and 15B formed on the semiconductor layers 12R, 12G and 12B. Although not shown, an etching stopper may be formed on an upper surface of the semiconductor layers 12R, 12G and 12B, thereby preventing the semiconductor layers 12R, 12G and 12B from being etched while the source electrodes 14R, 14G and 14B and the drain electrodes 15R, 15G and 15B are etched.

The gate electrodes 11R, 11G and 11B may be formed of a metallic material such as Cr, Mo, Ta, Cu, Ti, Al and Al alloy. A gate insulating layer 22 may be a single layer formed of an inorganic insulating material such as SiO2 or SiNx, or a double layer formed of SiO2 or SiNx. The semiconductor layers 12R, 12G and 12B may be formed of a crystalline semiconductor such as amorphous silicon (a-Si), or a transparent oxide semiconductor such as indium gallium zinc oxide (IGZO). And, the source electrodes 14R, 14G and 14B and the drain electrodes 15R, 15G and 15B may be formed of Cr, Mo, Ta, Cu, Ti, Al or Al alloy.

A first insulating layer 24 is formed on the first substrate 10 where the driving TFT has been formed. The first insulating layer 24 may be formed of an inorganic insulating material such as SiO2 in a thickness of about 4500 angstroms. R, G and B pixels of the first insulating layer 24 are provided with an R-color filter layer 17R, a G-color filter layer 17G and a B-color filter layer 17B, respectively.

A second insulating layer 26 is formed on the R-color filter layer 17R, the G-color filter layer 17G and the B-color filter layer 17B. The second insulating layer 26 is an overcoat layer for planarizing the first substrate 10, which may be formed of an organic insulating material such as photo-acryl in a thickness of about 3 μm.

Contact holes 29 are formed at the first insulating layer 24 and the second insulating layer 26 which are formed above the drain electrodes 15R, 15G and 15B of the driving TFT formed at the R, G and B pixels, respectively. Through the contact holes 29, pixel electrodes 21R, 21G and 21B are electrically connected to the drain electrodes 15R, 15G and 15B of the driving TFT, respectively.

A bank layer 28 is formed at each boundary between the pixels on the second insulating layer 26. The bank layer 28 serving as a barrier partitions the pixels from each other, thereby preventing light outputted from one pixel from being mixed with light of a specific color outputted from the neighboring pixel. And, the bank layer 28 fills part of the contact hole 29, thereby reducing the occurrence of a stepped portion. This may prevent inferiority of the organic light-emitting device 23 due to an excessive stepped portion occurring when the organic light-emitting device 23 is formed.

The pixel electrodes 21R, 21G and 21B are formed of a transparent metallic oxide such as ITO (Indium Tin Oxide) or IZO (Indium Zinc Oxide). In the present disclosure, the pixel electrodes 21R, 21G and 21B may be formed at the R, G and B pixels in a thickness of about 500 angstroms, respectively.

The organic light-emitting device 23 includes a white organic light-emitting layer for emitting a white light, The white organic light-emitting layer may be formed by mixing a plurality of organic materials with each other, each organic material for emitting a single light of R or G or B. Alternatively, the white organic light-emitting layer may be formed by depositing a plurality of organic materials on each other, each organic material for emitting a single light of R or G or B. Although not shown, on the organic light-emitting device 23, may be formed not only an organic light-emitting layer, but also an electron injection layer and a hole injection layer for injecting an electron and a hole into the organic light-emitting layer, respectively, and an electron transport layer and a hole transport layer for transporting an injected electron and an injected hole to the organic light-emitting layer, respectively.

A common electrode 25 is formed on the organic light-emitting device 23 over the first substrate 10. The common electrode 25 is formed of Ca, Ba, Mg, Al, Ag, etc.

The common electrode 25 is a cathode of the organic light-emitting device 23, and the pixel electrodes 21R, 21G and 21B are anodes. Once a voltage is applied to the common electrode 25 and the pixel electrodes 21R, 21G and 21B, an electron outputted from the common electrode 25 is injected into the organic light-emitting device 23, and a hole outputted from the pixel electrodes 21R, 21G and 21B is injected into the organic light-emitting device 23. As a result, an exciton is generated in the organic light-emitting layer. As the exciton is decayed, generated is light corresponding to an energy difference between LUMO (Lowest Unoccupied Molecular Orbital) and HOMO (Highest Occupied Molecular Orbital). The generated light is emitted to the outside (the first substrate 10 in drawings). The R, G and B light-emitting layers included in the organic light-emitting layer emit a red light, a green light and a blue light. As the emitted R, G and B lights are mixed with each other, a white light is emitted. As the emitted white light passes through the R-color filter layer 17R, the G-color filter layer 17G and the B-color filter layer 17B, only light having a color of corresponding pixel is output.

An adhesive agent is deposited over the common electrode 25, thereby forming an adhesive layer 42. A second substrate 50 is formed on the adhesive layer 42, and the second substrate 50 is attached to the first substrate 16 by the adhesive layer 42. For the adhesive agent, any material having a high bonding force, that is also heat-resistant and water-resistant may be used. Examples include a thermosetting resin such as an epoxy-based compound, an acrylate-based compound or an acryl-based rubber. In one embodiment, the adhesive layer 42 is deposited with a thickness of about 5~100 μm, and is hardened at a temperature of about 80~170° C. The adhesive layer 42 serves to attach the first substrate 10 and the second substrate 50 to each other, and serves as an encapsulating agent for preventing moisture from entering into the organic light-emitting display device. In the present disclosure, reference numeral 42 denotes an adhesive agent for convenience. However, reference numeral 42 may denote an encapsulating agent.

The second substrate 50 acts as an encapsulation cap for encapsulating the adhesive layer 42. The second substrate 50 may be formed of a passivation film such as a PS (Polystyrene) film, a PE (Polyethylene) film, a PEN (Polyethylene Naphthalate) film or a PI (Polyimide) film. The second substrate 50 may also be formed of plastic, glass, metal, or any other material that can protect the components formed on the first substrate 10.

An auxiliary electrode 52 may be formed between the first substrate 10 and the second substrate 50 on an outer peripheral region of the organic light-emitting display device. A first metallic pattern 54 is formed at the first substrate 10, and a second metallic pattern 56 is formed at the second substrate 50. The first metallic pattern 54 is electrically connected to the data line of the first substrate 10 through contact holes (not shown) of the first insulating layer 24 and the second insulating layer 26. Since the auxiliary electrode 52 is connected to the first metallic pattern 54 and the second metallic pattern 56, the auxiliary electrode 52 is electrically connected to the pixel electrodes 21R, 21G and 21B of the first substrate 10.

The auxiliary electrode 52 reduces signal delay in the organic light-emitting display device. An image signal applied to one side of the organic light-emitting display device is supplied to another side of the organic light-emitting display device through the data line. Generally, the data line is formed of a metallic material. When the organic light-emitting display device is small, a path toward the pixel electrodes 21R, 21G and 21B is short, and thus a signal delay due to a metallic resistance does not occur. However, when organic light-emitting display device is large, a path toward the pixel electrodes 21R, 21G and 21B is long, and thus a signal delay due to a metallic resistance occurs. This signal delay may lower the quality of the organic light-emitting display device.

Due to the auxiliary electrode 52, another signal path is formed between the pixel electrodes 21R, 21G and 21B. This may reduce signal delay due to metallic resistance. When an image signal is applied to the pixel electrodes 21R, 21G and 21B, a portion of the image signal is supplied to the pixel electrodes 21R, 21G and 21B along the data line on the outer peripheral region of one side of the first substrate 10. Another portion of the image signal is supplied to the data line on the outer peripheral region of another side of the first substrate 10 through the first metallic pattern 54, the auxiliary electrode 52, and the second metallic pattern 56. This portion of the image signal also travels to the pixel electrodes 21R, 21G and 21B.

The first metallic pattern 54 and the second metallic pattern 56 may be formed of aluminum (Al) or an aluminum alloy having high electric conductivity. The auxiliary electrode 52 may be formed of silver (Ag). The auxiliary electrode 52 may be formed as a dot having an area. The area may be predetermined. The gap between the auxiliary electrodes 52 is filled by the adhesive layer 42. Alternatively, the adhesive layer 42 is an adhesive conductive film that acts both as the adhesive layer 42 and also as the auxiliary electrode 52. The adhesive conductive film may be made of a single material that couples both electrically and physically, or the adhesive conductive film may be made of multiple materials that each either facilitate electrical or physical coupling.

A pressure is applied to the first substrate 10 and the second substrate 50, which causes the adhesive layer 42 to attach the first substrate 10 and the second substrate 50 to each other.

FIG. 3 is a planar view of an organic light-emitting display device where the first substrate 10 and the second substrate 50 have been attached to each other according to the present disclosure. As shown in FIG. 3, the organic light-emitting display device has an active region (A/A) where an image is substantially implemented, and a dummy region (D) bordering the active region (A/A) on all sides. The dummy region (D) includes a pad for connecting the organic light-emitting display device to an external system. The first substrate is attached to the second substrate by the adhesive layer 42, and the attached first and second substrates are encapsulated. In one embodiment, a number of auxiliary electrodes 52 are formed on an outer peripheral region of the organic light-emitting display device.

The adhesive layer 42 is formed to have a round shape at corner regions. Generally, the adhesive layer 42 is formed in the same shape as the organic light-emitting display device in regions other than the corner regions. The round shape of the adhesive layer 42 may be a circular shape having a radius of about 0.5~5 mm. The round shape of the adhesive layer 42 may also be an oval shape or a wave shape, for example. A wave shape includes a circular or oval shape with some smaller scale undulations breaking up the uniformity of the overall rounded shape.

The rounded shape more uniformly distributes the formation of cracks near the corner region than a similar rectangular shaped corner. When the first substrate and the second substrate of the organic light-emitting display device are attached to each other, the adhesive layer 42 may have cracks on an outer surface due to contact with air. To prevent moisture from reaching the active area (A/A), the organic light-emitting display device is designed so that the cracks of the adhesive layer 42 can exist only in the dummy region (D).

In existing organic light-emitting display devices, the attachment pressure concentrated on the corner regions of the adhesive layer causes cracks to form in the adhesive layer. Once the adhesive layer is hardened, air and moisture may enter the cracks. If the corner regions are in close proximity to the active area of the display device, moisture may enter into the active area through the cracks.

In one embodiment, the gap between the first substrate and the second substrate on the rounded corner regions of the organic light-emitting display device is completely filled by an adhesive agent. Little to no empty space forms between the first substrate and the second substrate at the corner regions. As a result, no cracks occur at the corner regions. Cracks may occur along the outside of the rounded adhesive layer, and these cracks may come into contact with air. These cracks may have the same size as cracks occurring at the four sides of the adhesive layer 42. However, these cracks are present only on the dummy region (D). As the dummy region (D) is physically isolated from the active region (A/A), the cracks do not come into contact with the active region. This prevents moisture from coming into contact with the active region.

As shown in FIG. 3, the adhesive layer 42 has several spaces (or indentations) formed where side surfaces (or edges) of the first substrate 10 and the second substrate 50 are partially removed. Auxiliary electrode 52 may be formed in these spaces. In one case, the adhesive layer 42 is formed between the auxiliary electrodes 52 to prevent bending of the first substrate 10 and second substrate 52. In one embodiment, the adhesive agent is formed over the entire region between the first 10 and second 52 substrates, rather than solely around area where the auxiliary electrode 52 is positioned in order to decrease the amount of empty space between the two substrates.

If the adhesive layer 42 is not formed between the auxiliary electrodes 52, or if the space between the substrates is not substantially filled, the space remains as an empty space due to thicknesses of the auxiliary electrode 52 and the adhesive layer 42. In this instance, the first substrate 10 and the second substrate 50 are bent toward the empty space when the first substrate 10 and the second substrate 50 are attached to each other due to the attachment pressure. In one embodiment, the adhesive layer 42 is added first, and is then removed in the location where the auxiliary electrodes 52 are to be added. Further, in this instance, each indentation comprises corner regions. Similarly to the corner regions of the adhesive layer 52, the corner regions of the indentations may have rounded corners to control the creation of cracks in the indentations of the adhesive layer 42. In another embodiment, the indentations may have rectangular corners (e.g., at an angle of 90 degrees, or another similar angle) rather than rounded corners.

Figure 4A:
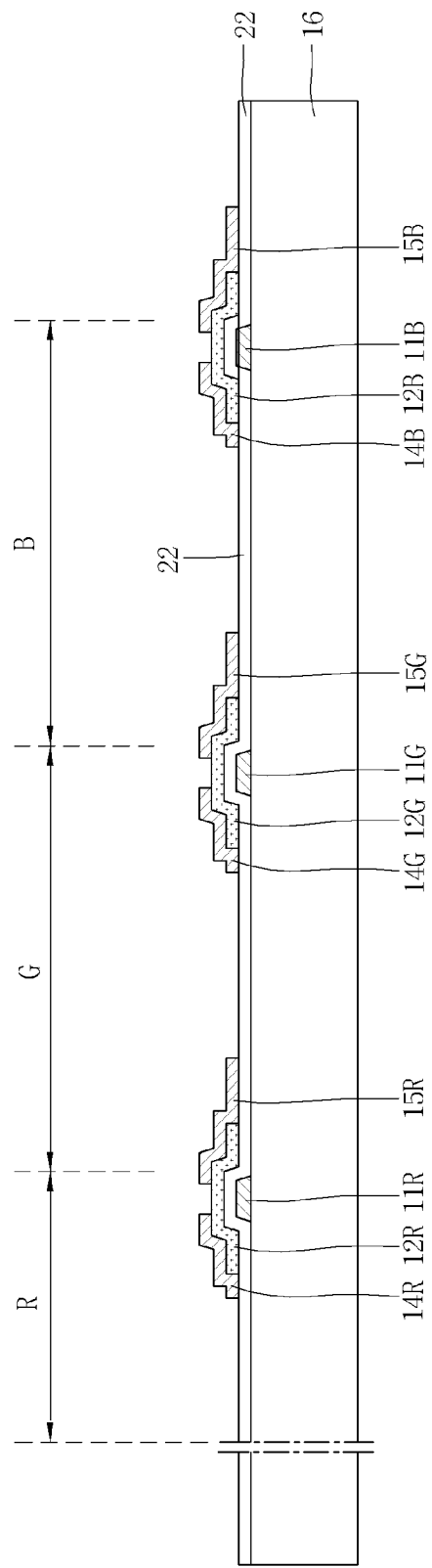
FIGS. 4A to 4E are views showing a method of fabricating an organic light-emitting display device according to the present disclosure.

FIGS. 4A to 4E are views showing a method of fabricating an organic light-emitting display device according to the present disclosure. As shown in FIG. 4A, prepared is a first substrate 10 formed of a transparent material such as glass or plastic. Next, an opaque metallic material having an excellent conductivity, such as Cr, Mo, Ta, Cu, Ti and Al or Al alloy, is deposited on the first substrate 10 by a sputtering process. Next, the opaque metallic material is etched by a photolithography process, thereby forming gate electrodes 11R, 11G and 11B.

Next, an inorganic insulating material is deposited, by a chemical vapor deposition (CVD) method, over the first substrate 10 where the gate electrodes 11R, 11G and 11B have been formed, thereby forming a gate insulating layer 22. Here, the gate insulating layer 22 may be formed of SiNx in a thickness of about 2000 angstroms.

Next, a semiconductor material such as amorphous silicon (a-Si) or a transparent oxide semiconductor such as indium gallium zinc oxide (IGZO) is deposited over the first substrate 10 by a CVD method, and then is etched, thereby forming semiconductor layers 12R, 12G and 12B. Although not shown, an ohmic contact layer may be formed by doping impurities to part of the semiconductor layers 12R, 12G and 12B, or by depositing impurity-included amorphous silicon on the semiconductor layers 12R, 12G and 12B.

Next, an opaque metallic material having high conductivity, such as Cr, Mo, Ta, Cu, Ti and Al or Al alloy, is deposited on the first substrate 10 by a sputtering process, and then is etched, thereby forming source electrodes 14R, 14G and 14B and drain electrodes 15R, 15G and 15B on the semiconductor layers 12R, 12G and 12B, specifically the ohmic contact layer.

Figure 4B:
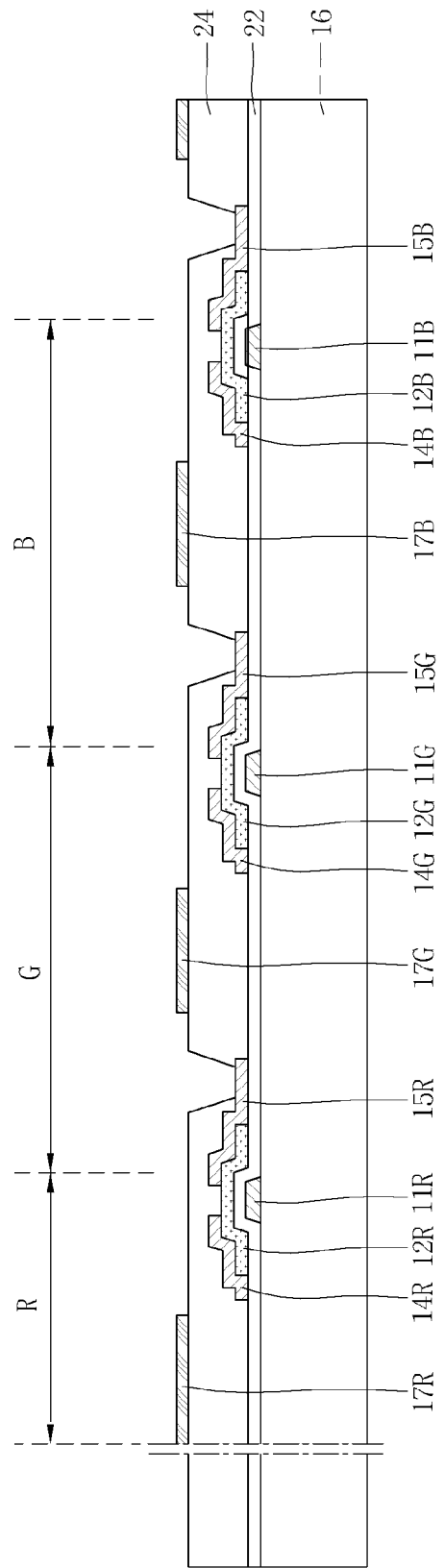

As shown in FIG. 4B, an inorganic insulating material is deposited over the first substrate 10 where the source electrodes 14R, 14G and 14B and the drain electrodes 15R, 15G and 15B have been formed, thereby forming a first insulating layer 24. As part of the first insulating layer 24 is etched, a contact hole 29 is formed. Here, the first insulating layer 24 may be formed of SiO2 in a thickness of about 4500 angstroms. Through the contact hole 29, the drain electrodes 15R, 15G and 15B of the TFT are exposed to the outside. Next, an R-color filter layer 17R, a G-color filter layer 17G and a B-color filter layer 17B are formed on the first insulating layer 24 in R, G and B pixels, respectively.

Figure 4C:
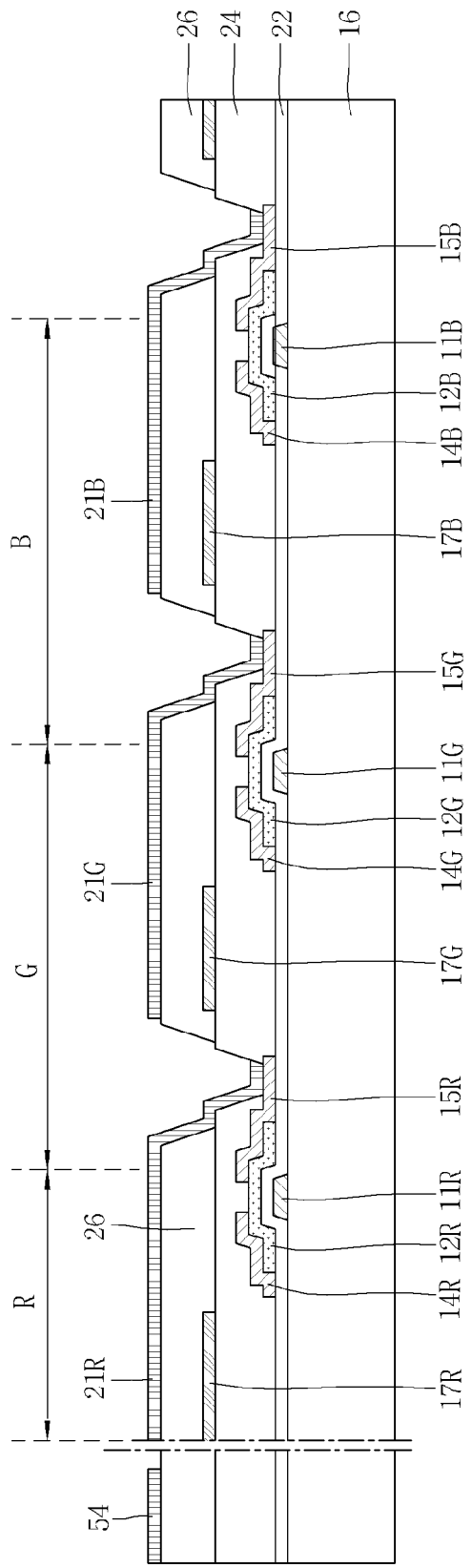

Next, as shown in FIG. 4C, an organic insulating material such as photo-acryl is deposited over the first substrate 10 where the R-color filter layer 17R, the G-color filter layer 17G and the B-color filter layer 17B have been formed, thereby depositing a second insulating layer 26 having the contact hole 29. Here, the second insulating layer 26 may be formed in a thickness of about 3 μm, and may be etched. Through the contact hole 29 of the second insulating layer 26, the drain electrodes 15R, 15G and 15B are exposed to the outside.

In the aforementioned description, the contact holes 29 are implemented as the first insulating layer 24 and the second insulating layer 26 are separately formed. However, the contact holes 29 may be simultaneously formed. More concretely, the contact hole 29 may be formed by depositing the first insulating layer 24 and the second insulating layer 26 on each other, and then by etching the first and second insulating layers by a single etching process.

Next, a transparent conductive material such as ITO or IZO is deposited on the second insulating layer 26 by a sputtering method, and then is etched, thereby forming pixel electrodes 21R, 21G and 21B. Here, the pixel electrodes 21R, 21G and 21B are extended to the inside of the contact hole 29, and electrically connected to the drain electrodes 15R, 15G and 15B of the TFT. The pixel electrodes 21R, 21G and 21B of one pixel are electrically insulated from the pixel electrodes 21R, 21G and 21B of a neighboring pixel.

A first metallic pattern 54 is formed on the second insulating layer 26 on the outer peripheral region of the first substrate 10. The first metallic pattern 54 may be formed of a metallic material having high conductivity. Alternatively, the first metallic pattern 54 may be formed of a transparent conductive material such as ITO or IZO, and may be simultaneously formed with the pixel electrodes 21R, 21G and 21B.

Figure 4D:
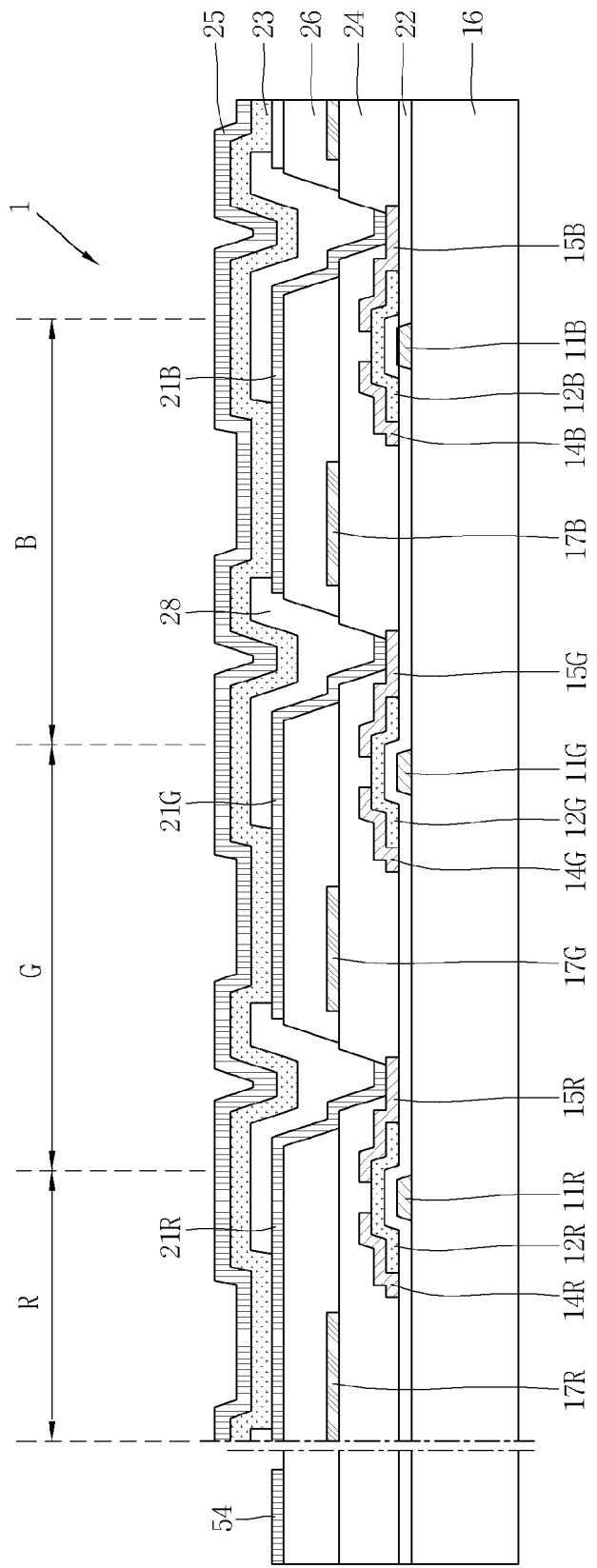

As shown in FIG. 4D, a bank layer 28 is formed between pixels. The bank layer 28 partitions pixels from each other, thereby preventing light outputted from one pixel from being mixed with light of a specific color outputted from the neighboring pixel. And, the bank layer 28 fills part of the contact hole 29, thereby reducing the occurrence of a stepped portion. The bank layer 28 may be formed by depositing an inorganic insulating material by a CVD method, and then by etching the inorganic insulating material. Alternatively, the bank layer 28 may be formed by depositing an organic insulating material, and then by etching the organic insulating material.

An organic light-emitting unit 23 is formed over the first substrate 10 where the bank layer 28 and the pixel electrodes 21R, 21G and 21B have been formed. The organic light-emitting unit 23 may consist of an electron injection layer, an electron transport layer, a white organic light-emitting layer, a hole transport layer and a hole injection layer. The white organic light-emitting layer may be a mixed layer of an R-organic light-emitting material, a G-organic light-emitting material, and a G-organic light-emitting material. Alternatively, the white organic light-emitting layer may have a structure where an R-organic light-emitting layer, a G-organic light-emitting layer, and a G-organic light-emitting layer are deposited on each other. The electron injection layer, the electron transport layer, the organic light-emitting layer, the hole transport layer and the hole injection layer may be formed of various materials deposited on each other.

Next, a metallic material such as Ca, Ba, Mg, Al and Ag is deposited on the organic light-emitting unit 23, thereby forming a common electrode 25.

Figure 4E:
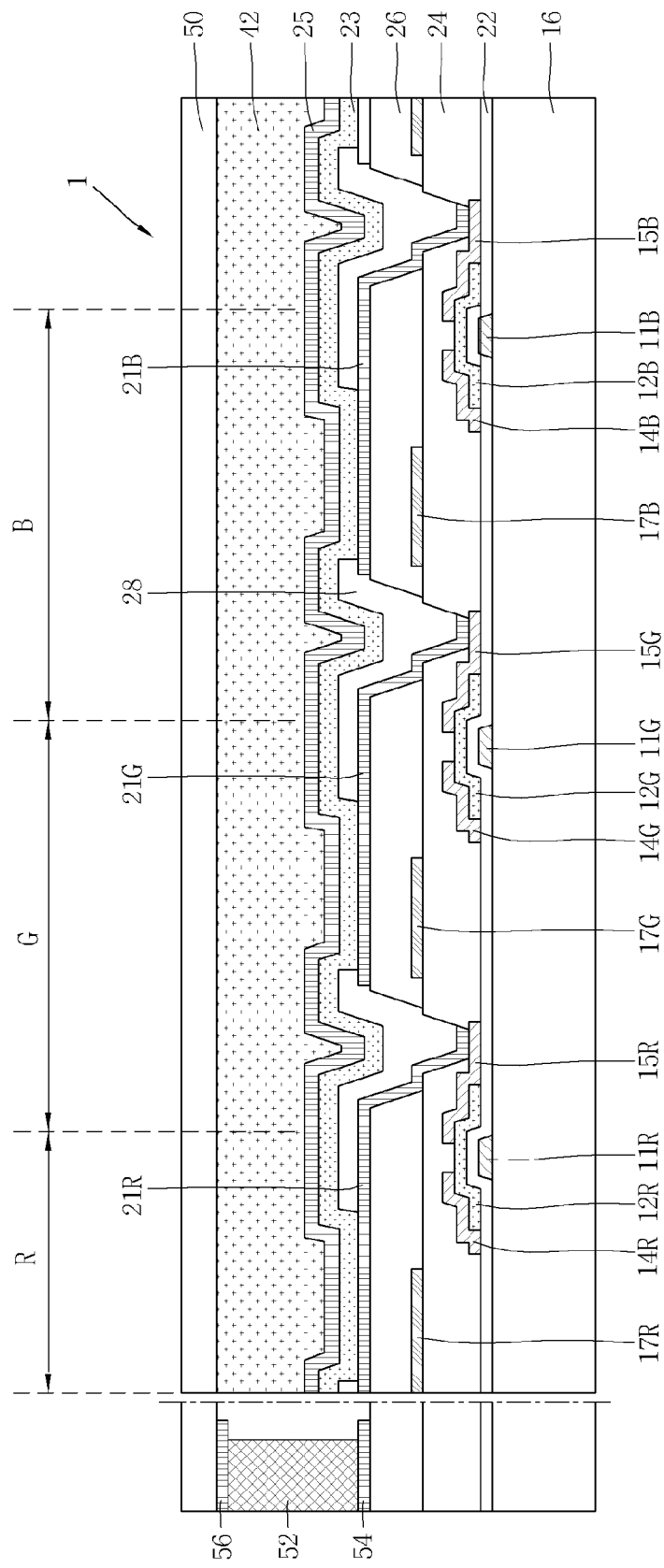

As shown in FIG. 4E, a second substrate 50 is prepared, and then a second metallic pattern 56 is formed on the second substrate 50. The second metallic pattern 56 may be formed of a metallic material having high conductivity. Then, an adhesive layer 42 formed of a thermosetting resin such as an epoxy-based compound, an acrylate-based compound or an acryl-based rubber is deposited in a thickness of about 5~100 μm. Then, a silver (Ag) dot is formed on the second substrate 50 to form an auxiliary electrode. The adhesive layer 42 may be formed after the auxiliary electrode 52 has been formed on the second substrate 50.

The adhesive layer 42 is formed in the same shape as the first substrate 10 and the second substrate 50. However, corner regions of the adhesive layer 42 are formed in a round shape. In regions where the auxiliary electrodes 52 are to be positioned, the adhesive layer 42 is removed. As the adhesive layer 42, an adhesive film may be used. In this case, the adhesive film is applied after processing the corner regions of the adhesive layer 42 in a round shape, and then removing regions where the auxiliary electrodes 52 are to be formed.

Next, the second substrate 50 is positioned over the first substrate 10, and an attachment pressure is applied to the first substrate 10 and the second substrate 50 to attach the first substrate 10 and the second substrate 50 to each other. The adhesive agent or adhesive film is deposited onto the first substrate 10, and then the second substrate 50 may be positioned on the first substrate for attachment. In another embodiment, the adhesive agent or adhesive film may be deposited onto the second substrate 50 and the first substrate 10 may be positioned on the second substrate for attachment.

The second substrate 50 may be formed of glass or plastic, or a passivation film such as a PS (Polystyrene) film, a PE (Polyethylene) film, a PEN (Polyethylene Naphthalate) film and a PI (Polyimide) film.

After the first substrate 10 and the second substrate 50 have been attached to each other, the adhesive layer 42 is heated to a temperature of about 80~170° to be hardened. As the adhesive layer 42 is hardened, the organic light-emitting display device is encapsulated to prevent introduction of moisture, etc. from the outside. The second substrate 50 serves as an encapsulation cap for encapsulating the organic light-emitting display device, thereby protecting the organic light-emitting display device.

The corner regions of the adhesive layer are formed in a circular shape having a radius (R) of about 0.5~5 mm. When the radius of the circular shape is 0.5 mm, cracks of the adhesive layer occurring at the corner regions are decreased to about ¼~¹⁄₁₀ the rate of occurrence in existing devices. As the radius of the round shape increases, the corner regions increase in surface area, and the attachment pressure applied to the corner regions decreases.

The aforementioned description discloses an organic light-emitting display device of a specific structure. However, the present disclosure is not limited to the organic light-emitting display device of a specific structure.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:
1. An organic light-emitting display device, comprising:
   a first substrate including a plurality of pixels, each pixel including a thin film transistor (TFT) and an organic light-emitting unit configured to emit light;
   a second substrate;

a first metallic pattern formed over the first substrate, the first metallic pattern being electrically connected to a pixel electrode electrically coupled to each of the pixels;

a second metallic pattern formed over the second substrate;

a plurality of auxiliary electrodes formed between the first substrate and the second substrate to electrically connect the first and second metallic patterns; and an adhesive layer to attach the first to the second substrates, the adhesive layer comprising a plurality of corner regions, each corner region having a rounded shape, the adhesive layer shaped in an alternating pattern including a plurality of indentations, each auxiliary electrode formed in an indentation of the alternating pattern.

2. The organic light-emitting display device of claim 1, wherein the auxiliary electrodes each include a silver dot.

3. The organic light-emitting display device of claim 1, wherein the adhesive layer is an adhesive conductive layer formed between the first and second metallic patterns.

4. The organic light-emitting display device of claim 1, wherein each pixel comprises a pixel electrode electrically coupled to the organic light-emitting unit, and wherein the first substrate comprises a common electrode electrically coupled to each pixel electrode.

5. The organic light-emitting display device of claim 1, wherein the adhesive layer is formed of at least one of an epoxy-based compound, an acrylate-based compound, and an acryl-based rubber.

6. The organic light-emitting display device of claim 1, wherein the adhesive layer has a thickness of 5-100 nm.

7. The organic light-emitting display device of claim 1, wherein the rounded shape includes at least one of a circular shape, an oval shape and a wave shape.

8. The organic light-emitting display device of claim 7, wherein the circular shape has a radius of 0.5-5 mm, inclusive.

* * * * *